United States Patent
Kang et al.

(10) Patent No.: US 8,505,474 B2
(45) Date of Patent: Aug. 13, 2013

(54) ELECTRICALLY CONDUCTIVE METAL COMPOSITE EMBROIDERY YARN AND EMBROIDERED CIRCUIT USING THEREOF

(75) Inventors: Tae Jin Kang, Seoul (KR); Byung Duck Kim, Gyeonggi-do (KR); Young Seung Chi, Seoul (KR); Jung Sim Roh, Gyeonggi-do (KR)

(73) Assignee: SNU R&DB Foundation, Seoul (KR)

( * ) Notice: Subject to any disclaimer, the term of this patent is extended or adjusted under 35 U.S.C. 154(b) by 884 days.

(21) Appl. No.: 12/668,930

(22) PCT Filed: Jul. 30, 2008

(86) PCT No.: PCT/KR2008/004439
§ 371 (c)(1),
(2), (4) Date: Jan. 13, 2010

(87) PCT Pub. No.: WO2009/017362
PCT Pub. Date: Feb. 5, 2009

(65) Prior Publication Data
US 2010/0199901 A1 Aug. 12, 2010

(30) Foreign Application Priority Data

Jul. 31, 2007 (KR) .......................... 10-2007-0076893
Jul. 29, 2008 (KR) .......................... 10-2008-0074076

(51) Int. Cl.
*D05B 3/00* (2006.01)
*D02G 3/36* (2006.01)

(52) U.S. Cl.
USPC ..................................... 112/475.18; 57/244

(58) Field of Classification Search
USPC .............. 112/439, 475.17, 475.18; 361/212; 442/377; 174/110 R; 57/244, 311
See application file for complete search history.

(56) References Cited

U.S. PATENT DOCUMENTS

| | | | |
|---|---|---|---|
| 3,639,807 A * | 2/1972 | McCune | 361/220 |
| 6,136,434 A | 10/2000 | Jang et al. | |
| 6,210,771 B1 * | 4/2001 | Post et al. | 428/100 |
| 6,493,933 B1 | 12/2002 | Post et al. | |
| 7,248,756 B2 * | 7/2007 | Ebbesen et al. | 385/14 |
| 7,902,095 B2 * | 3/2011 | Hassonjee et al. | 442/377 |
| 8,294,029 B2 * | 10/2012 | Tatsumi | 174/110 R |
| 2005/0235482 A1 * | 10/2005 | Deaett et al. | 29/600 |
| 2006/0289469 A1 | 12/2006 | Chandra et al. | |

FOREIGN PATENT DOCUMENTS

KR    10-0688899    2/2007

OTHER PUBLICATIONS

International Search Report for PCT/KR2008/004439, mailed Jan. 23, 2009.

* cited by examiner

*Primary Examiner* — Ismael Izaguirre
(74) *Attorney, Agent, or Firm* — Nixon & Vanderhye P.C.

(57) ABSTRACT

The present invention relates to an electrically conductive metal composite embroidery yarn and embroidered circuit using thereof which may be applicable to smart textiles. More particularly, this invention relates to an electrically conductive metal composite embroidery yarn and embroidered circuit for smart textiles which can be used as power supply and signal transmission lines. The present invention provides an embroidered circuit which consists of a metal composite embroidery yarn and a dielectric fabric substrate, wherein the electrically conductive metal composite embroidery yarn is embroidered on the dielectric fabric substrate to form a circuit.

4 Claims, 4 Drawing Sheets

ELECTRICALLY CONDUCTIVE METAL COMPOSITE EMBROIDERY YARN AND EMBROIDERED CIRCUIT USING THEREOF

This application is the U.S. national phase of International Application No. PCT/KR2008/004439, filed 30 Jul. 2008, which designated the U.S. and claims priority to KR Application No. 10-0076893, filed 31 Jul. 2007 and KR Application No. 10-2008-0074076, filed 29 Jul. 2008, the entire contents of each of which are hereby incorporated by reference.

TECHNICAL FIELD

The present invention relates to an electrically conductive metal composite embroidery yarn and embroidered circuit using thereof, and more particularly, to an electrically conductive metal composite embroidery yarn that can be used as power supplies and signal transmission lines for smart textiles and embroidered circuit using thereof.

BACKGROUND ART

Smart interactive textile systems refer to an intelligent textile system that provides a smart environment for users by responding and reacting spontaneously to outside stimulus. In order to achieve smart interactive textile systems, there needs to be a textile infrastructure where sensors, actuators, power sources and data processing and communication devices are electrically interconnected. And further, these electrical devices should be applicable to textiles.

An electronic circuit is a closed path formed by the interconnection of electronic components through which an electric current can flow. The PCB, or Printed Circuit Board is at present a widely used electronic circuit, in which a conductive line or signal line is wet-etched on a dielectric substrate. PCB is sturdy, inexpensive and highly reliable, but it is rigid and heavy with space limitations. The FPCB or Flexible Printed Circuit Board improves these drawbacks by using copper-foiled polyimide films which bend flexibly. The FPCB, having advantages of being easy to form detailed patterns, flexible, light-weighted and of occupying less space, is widely applicable to display-related products such as LCD and PDP modules, etc. However, its complex manufacturing process leads to increased production cost and a harmful working environment. Moreover, its limited flexibility causes the copper foil to break after excessive deformation. Meanwhile, a project on stretchable electronics, or STELLA which is carried out by the EU for use in healthcare, wellness and functional clothes, has integrated electronics in stretchable parts and products. Stretchable electronics integrate electronic components, energy supply, sensors, actuators, or display and switches on a stretchable substrate such as silicon or polyurethane. However, the method does not involve textile processing and thus is not applicable in many applications of smart textiles.

U.S. Patent Publication No. 2006-0289469 discloses a flexible circuit that overcomes the shortcomings of the PCB or FPCB and works properly as part of wearable electronics. This prior art proposes materials embroidered with silver-coated nylon yarns and a flexible circuit made by etching silver-coated nylon fabrics in any desired shape. The circuit is flexible, light-weighted, and attachable to clothes. However, the silver-coated textiles have limitations in reducing the electrical resistance to a desired level. Therefore in order to reduce electrical resistance, a number of metal-coated fibers should be used or multiple layers of the fabric should be stitched. That is, the circuit consists inevitably of thick lines or thick patches, as the conductive yarn is too thin to provide desired conductivity. Consequently, when applied to clothes or other textiles, the circuit has poor washing and abrasion durability. And when the silver-coated yarns are coated with PVC for electric insulation, the circuit can not be directly used as an embroidery yarn but only used as an applique.

Thus a need exists for an electrically conductive embroidered circuit that has low electrical resistance with washing and abrasion durability, and adequate strength to maintain electric capability under external force.

DISCLOSURE

Technical Problem

The object of the present invention is to provide an embroidered electrical circuit made of metal composite embroidery yarn which has electrical conductivity, durability and embroidering proccessability that smart textiles demand, and a dielectric fabric substrate, and smart interactive textile systems using thereof.

Technical Solution

In order to solve the above problems, according to the preferred embodiment of the present invention, an electrically conductive metal composite embroidery yarn is prepared by: the first process in which one or more metal filaments are wound in a covered state around the surface of fiber yarn to have a plurality of twists per meter; the second process in which the fiber yarn wounded with one or more metal filaments in the first process is twisted in S direction to have a plurality of twists per meter; and the third process in which the two or more of twisted yarns in S direction are plied together in Z direction to have a plurality of twists per meter, wherein the conductive material is insulated.

According to another preferred embodiment of the present invention, the insulation is an enamel coating.

According to another preferred embodiment of the present invention, the metal filament can be covered with multifilament yarns of 30 deniers or less for protection.

According to another preferred embodiment of the present invention, the conductive metal composite embroidered yarn comprises: fiber yarns; and one or more insulated metal filaments which are plied into the fiber yarns with a plurality of twists per meter, wherein the insulation is an enamel coating.

According to another preferred embodiment of the present invention, the metal filament is a copper filament.

According to another preferred embodiment of the present invention, the fiber yarn is polyester.

According to another preferred embodiment of the present invention, DC resistivity of the conductive metal composite embroidery yarn is 5.0 Ω/m or less.

According to another embodiment of the present invention, a conductive embroidered circuit consists of a metal composite embroidery yarn and a dielectric fabric substrate, in which the metal composite embroidery yarn is embroidered on the dielectric fabric substrate.

According to another embodiment of the present invention, the warp or weft of the dielectric fabric substrate is monofilament, and the weaving density of the weft is similar to that of the warp.

According to another embodiment of the present invention, the electrically conductive metal composite embroidered circuit is characterized by the metal composite embroidery yarn which is prepared by: the first process in which one or more metal filaments are wound in a covered state around the surface of fiber yarn to have a plurality of twists per meter; the second process in which the fiber yarn wounded with one or more metal filaments in the first process is twisted in S direction to have a plurality of twists per meter; and the third process in which at least two or more strands of S-twisted yarns in the second process are plied in Z direction to have a plurality of twists per meter.

According to another embodiment of the present invention, the electrically conductive metal composite embroidered circuit is characterized by the metal composite embroidery yarn which is prepared by: the first process in which fiber yarn is wound in a covered state around the surface of one or more metal filaments to have a plurality of twists per meter; the second process in which at least two or more strands of the metal filaments wounded with the fiber yarn in the first process are plied together in Z direction to have a plurality of twists per meter.

According to another embodiment of the present invention, the metal filaments may be silver, copper and stainless steel with a diameter range of 0.01 mm to 0.1 mm.

According to another embodiment of the present invention, the metal filaments are insulated.

According to another embodiment of the present invention, the insulation is an enamel coating.

According to another embodiment of the present invention, the metal filaments can be covered with multifilament yarns of 30 deniers or less for protection.

Advantageous Effects

The embroidered circuit using electrically conductive metal composite embroidery yarn of the present invention improves the shortcomings of the PCB or the FPCB in terms of flexibility, low weight, eco-friendliness, productivity, and design when applied to ordinary garments and other textiles. In addition, it significantly improves electrical conductivity and durability, compared to an embroidered circuit using a metal-coated fiber.

MODE FOR THE INVENTION

Figure 1:
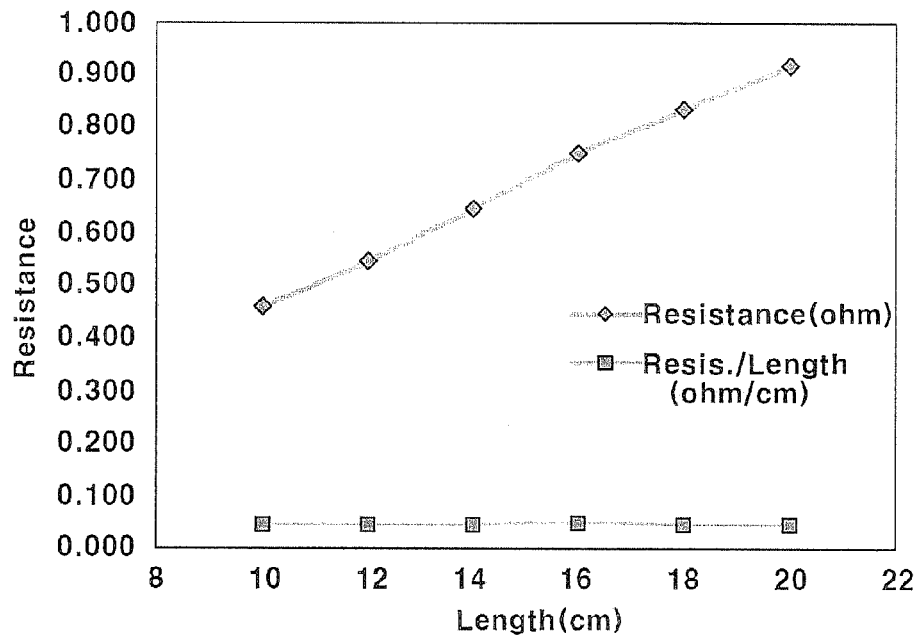
FIG. 1 is a graph showing the results on measurement of the DC resistance of the electrically conductive metal composite embroidery yarn in Example 2.
Figure 2:
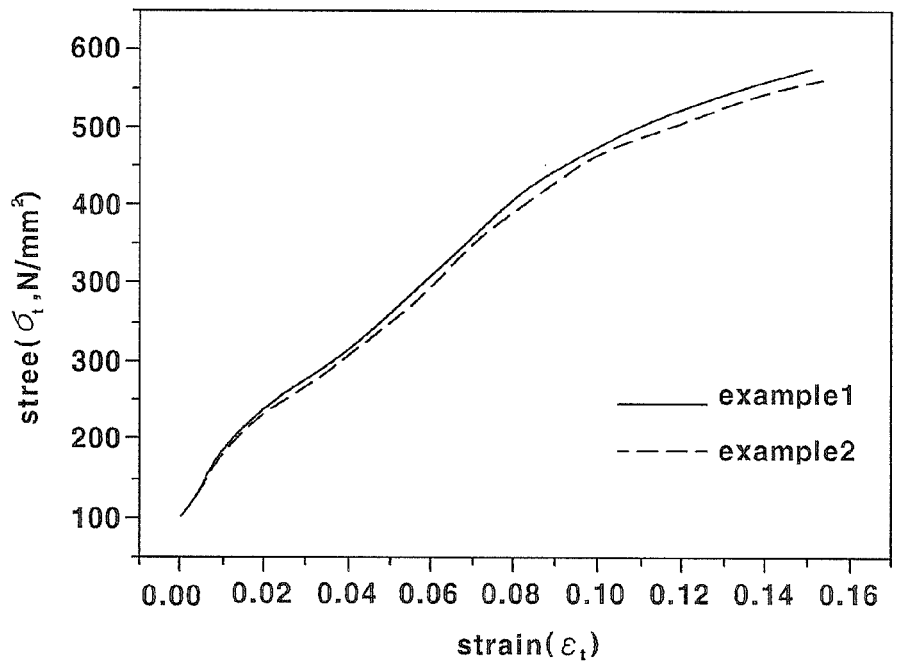
FIG. 2 is a graph showing the stress-strain curve of the electrically conductive metal composite embroidery yarn in Examples 1 and 2, which is measured using the INSTRON 5543 apparatus in accordance with the ASTM D2256 (Test method for breaking load (strength) and elongation of yarn by the single strand method).
Figure 3:
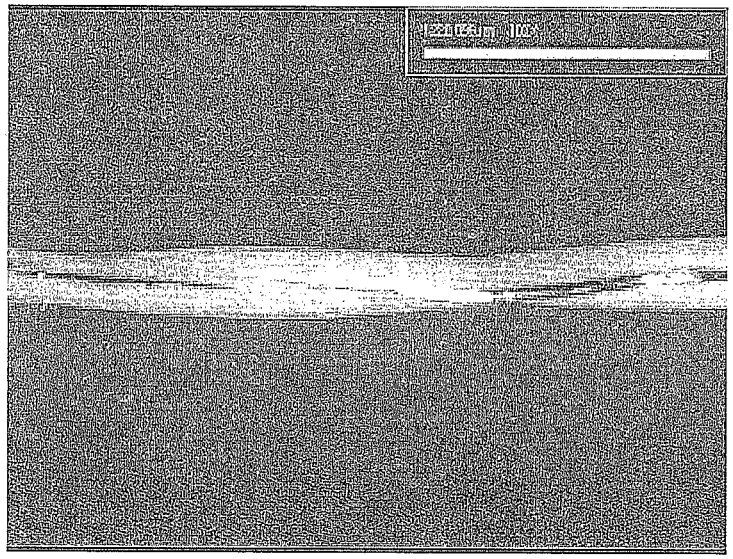
FIG. 3 shows one example of the electrically conductive metal composite embroidery yarn for use in an embroidered circuit.

Hereinafter the present invention will be described in detail with reference to drawings and embodiments.

The metal composite embroidery yarn of the present invention may adjust the type of metal, the number of plied strands and plying methods to thereby provide electrical and physical capabilities of the conductor that the smart interactive textile systems require. The metal composite embroidery yarn used herein comprises metal filaments, and fiber yarns that protect and support the metal filaments. The metal composite embroidery yarn may be prepared by two methods. In one method, the metal filaments are plied to appear on the surface of the metal composite embroidery yarn. In the other method, the metal filaments are plied to be disposed in a relatively regular position inside the metal composite embroidery yarn.

In the first method for preparing the metal composite embroidery yarn of the present invention, the metal filaments are plied around the surface of the fiber yarn with about 20~1000 TPM to prepare covered and twisted one-ply yarns. Then two or more of the covered and twisted one-ply yarns are plied with 200~1000 TPM in the opposite direction of that one-ply yarn. More specifically, the metal composite embroidery yarns are prepared by: the first process in which one or more strands of metal filaments are wound in a covered state around the surface of the fiber yarn to have a plurality of twists per meter; the second process in which the fiber yarn, around which the metal filaments are wound, is twisted in S direction to have a plurality of twists per meter; and the third process in which two or more of the twisted yarns with S twist in the second process are plied in Z twist to have a plurality of twists per meter.

In the first process, the metal filaments, which are wound around the fiber yarns, have 20 to 400 twists per meter. In the second process, the fiber yarns have 100 to 1000 twists per meter when twisted in S direction, and preferably 100 to 1000 twists per meter when plied in Z twist in the third process.

In the second method for preparing the metal composite embroidery yarn of the present invention, fiber yarns are covered with 300 to 2000 twists per meter on the metal filaments as a core to prepare a plurality of one-ply yarns, which are then plied with 100 to 1000 twists per meter in the opposite direction of the one-ply yarn.

More specifically, the metal composite embroidery yarn of the present invention is prepared by: the first process in which one or more strands of the fiber yarns are wound in a covered state around the surface of one or more of metal filaments; and the second process in which multiple metal filaments, around which the fiber yarns are wound, are plied in Z twist to have a plurality of twists per meter.

Using the metal composite embroidery yarn prepared in the first method enables high-quality embroidery, and the product using thereof has great strength and durability. And it is also preferable for the products that require ohmic contacts with metal composite yarns. The second method can be used for an electric circuit that demands high electrical homogeneity, in which uniformity of the distance between metal filaments and the electrical resistance is required, though the manufacturing proccessability may be degraded.

The fiber yarns of the present invention may preferably use but not limited to polyester, nylon, silk, cotton, etc.

The metal filaments used herein are highly conductive metal filaments such as silver, copper, stainless steel, etc. An electrically conductive thread that has the electrical conductivity of a metal may be used as it is, or an insulated electrical conductive thread may preferably be used. The insulation method may include fully covering the conductive yarn with PVC coating or nonconductive yarns by braiding, or coating with enamel, etc. The present invention may preferably use the metal filaments coated with enamel. The electrically conductive metal composite embroidery yarn using the enamel-coated metal filaments are the closest to ordinary sewing thread or embroidery yarn in terms of appearance and mechanical properties. In addition, the enamel-coated metal filaments are the least expensive in the market and easy to produce. The number of strands of metal filaments may be properly adjusted according to different uses thereof.

The metal filaments may be covered with multifilament yarns of 30 deniers or less to protect the metal from possible damage during an embroidering process. The protection yarns may preferably be, but not limited to, polyester.

The thickness of the electrically conductive metal composite embroidery yarn prepared may be determined by the thickness of a single filament of the metal and a fiber yarn and by the number of yarns used during the plying process.

The thickness of the fiber yarn of the present invention is preferably in the range of 50~300 deniers. And the thickness of a single strand of the metal filament is preferably in the range of 0.01 mm~0.1 mm. The thickness thereof may properly be adjusted depending on the type of materials or uses. Specifically, in the case of transmission lines for clothing, silver-plated copper filament coated with enamel may be used in the thickness range of 10~50 μm, and preferably in the range of 10~100 μm for interior textiles.

The embroidered circuit using the metal composite embroidery yarn of the present invention may be formed by using the metal composite embroidery yarn and a dielectric fabric substrate. The metal composite embroidery yarn is prepared to match the electrical characteristics that the smart interactive textile system demands and to maximize the signal transmission efficiency. The dielectric fabric is used as a substrate to maintain an embroidered construction of the metal composite embroidery yarn. The metal composite embroidery yarn may be prepared by adjusting the yarn processing conditions in order to accommodate the required electric conductivity, workability and thickness. The embroidered circuit designed considering the capability of the metal composite embroidery yarn thus produced may be useful in various applications of smart interactive textile systems, such as resistive heating fabrics, textile antennas, textile power and signal transmission lines, textile sensors, textile keyboards and switches, textile display and communication devices, wearable electronics, etc.

The substrate material for embroidery used herein may be knitted, woven and nonwoven fabrics prepared by using dielectric materials such as nylon, polyester, acryl, spandex, cotton, wool and silk, etc. The metal composite embroidery yarn of the present invention is prepared by covering and twisting two different yarns having quite different properties, that is, superfine metal filament yarn and relatively thicker ordinary yarn. Therefore, in order to manufacture a smart textile product that requires homogeneous electric capability, such as an antenna circuit, the embroidered circuit using metal composite embroidery yarn should have a uniform appearance and stable structure. In this case, a fabric substrate which has high dimensional stability, and is durable enough to maintain an embroidered construction of the metal composite embroidery yarn should be used. Especially, the material should not hamper the movement of the user and should be thin so as to be applied to a smaller and low weight product. For this purpose, the warp or weft of the fabric is preferably a synthetic fine monofilament of 10~20 deniers. In addition, the fabric substrate used herein should preferably be of high density of 150 to 300 threads per inch so that the elongation of the material can be minimized. Also the warp and the weft of the material should be produced with similar weaving density to achieve uniform tensile strength in the both directions.

Figure 4:
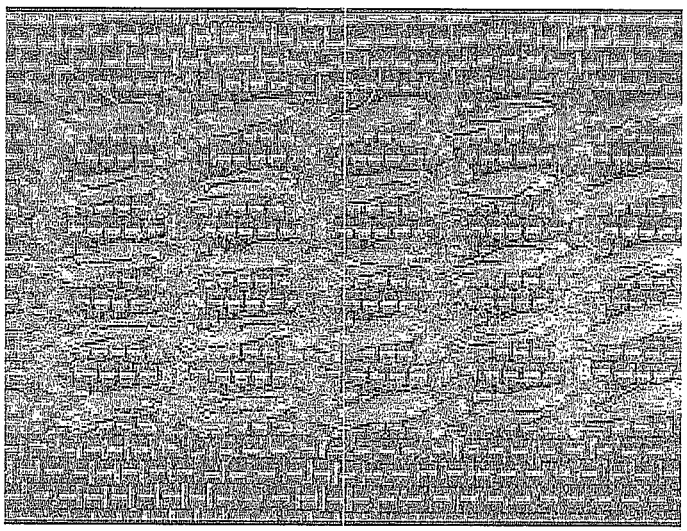
FIG. 4 shows one example of the embroidered circuit of the present invention.
Figure 5:
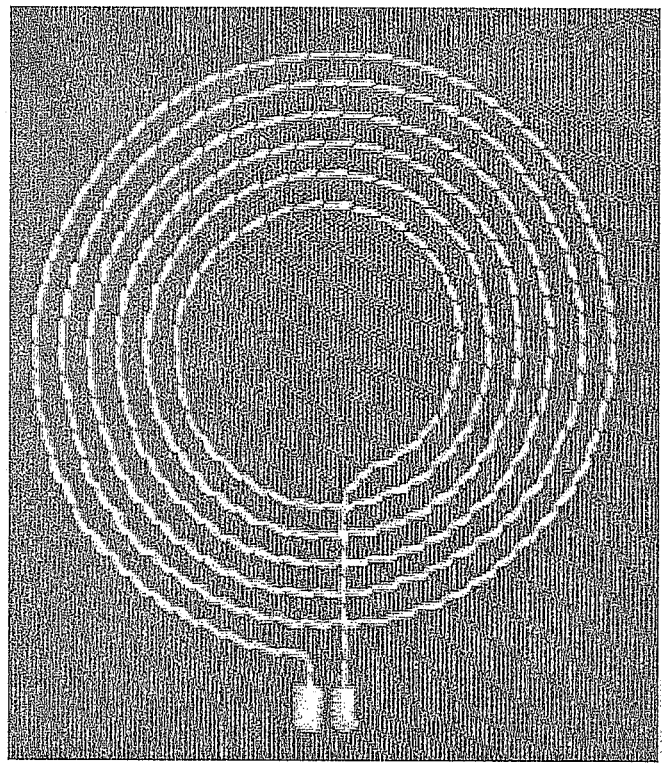
FIG. 5 shows one example of the embroidered circuit of the present invention.
Figure 6:
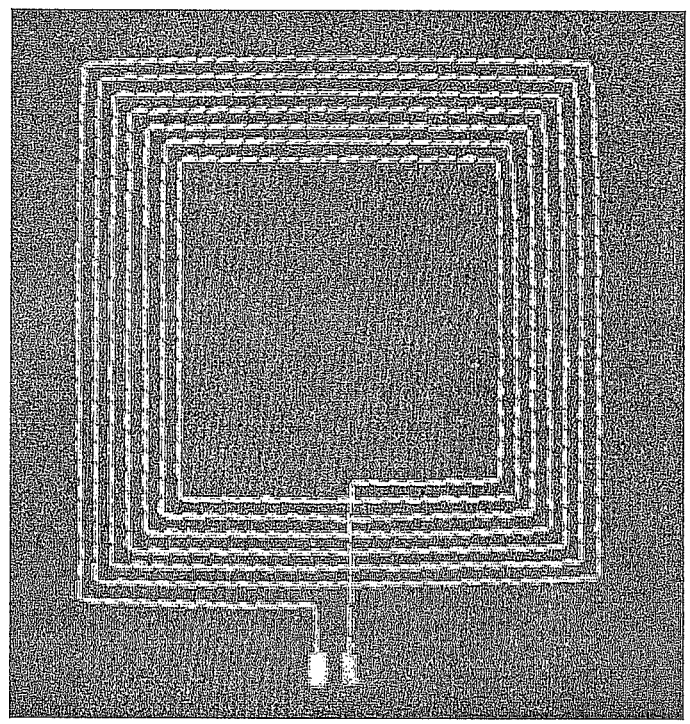
FIG. 6 shows one example of the embroidered circuit of the present invention.

The embroidered circuit using metal composite embroidery yarn may be produced as shown in FIGS. 4, 5 and 6. The embroidered circuit using metal composite embroidery yarn may be formed by embroidering suitable circuit patterns on the fabric substrate according to its usage. For example, various forms of quilted anti-static materials, fashionably designed power supply lines, resistive heaters, spiral sensors, fractal shaped antennas, keypads, switches, etc. are possible. The circuit patterns designed in consideration of circuit factors, such as impedance, inductance and capacitance may be produced in its minute forms and sizes to the extent of 0.2 mm, by using precision computer embroidery techniques currently used in the textile industry. In the case of using a metal composite embroidery yarn that comprises enamel-coated metal filaments, the overlapped embroidery stitches enable air bridges, thereby allowing various forms of textile loop antennas.

Hereinafter, the present invention will be described in further detail with examples. The examples can be modified and it should not be construed that the scope of the present invention is limited thereto.

EXAMPLE 1

Preparation of Electrically Conductive Metal Composite Embroidery Yarn for Smart Textiles A strand of enamel coated silver-plated copper filament having a diameter of 0.040 mm (DC resistance: 13.6 Ω/m) is covered with 150 TPM around the surface of a strand of polyester yarn 75d/36f. And this enamel coated silver-plated copper filament covered polyester yarn is twisted in S direction with 700 TPM. Three strands with S twist are plied together in Z direction with 550 TPM. The DC resistance of the electrically conductive metal embroidery yarn thus prepared is about 4.69 Ω/m.

EXAMPLE 2

Preparation of Electrically Conductive Metal Composite Embroidery Yarn for Smart Textiles A silver-plated copper filament having a diameter of 0.040 mm (DC resistance: 13.4 Ω/m) is covered with 150 TPM around the surface of a strand of polyester yarn 75d/36f. And this silver-plated copper filament covered polyester yarn is twisted in S direction with 700 TPM. Three strands with S twist are plied together in Z direction with 550 TPM. The DC resistance of the electrically conductive metal composite embroidery yarn thus produced is about 4.6 Ω/m.

EXAMPLE 3

Preparation of Electrically Conductive Metal Composite Embroidery Yarn for Smart Textiles Using a strand of silver-plated copper filament having a diameter of 0.040 mm (DC resistance: 13.7 Ω/m) as a core, three one-ply strands, prepared by covering polyester yarn with 800 TPM, are plied together in Z twist with 450 TPM. The DC resistance of the electrically conductive metal composite embroidery yarn thus produced is about 4.78 Ω/m.

EXAMPLE 4

Manufacture of Textile Transmission Line

The metal composite embroidery yarn prepared in Example 1 is stitched with the stitch size of 2 mm at intervals of 0.8 mm on an ordinary polyester fabric. The DC resistance of the textile transmission line thus produced is about 1.5 Ω/m.

EXAMPLE 5

Manufacture of Circular, Spiral Textile Inductor

Figure 7:
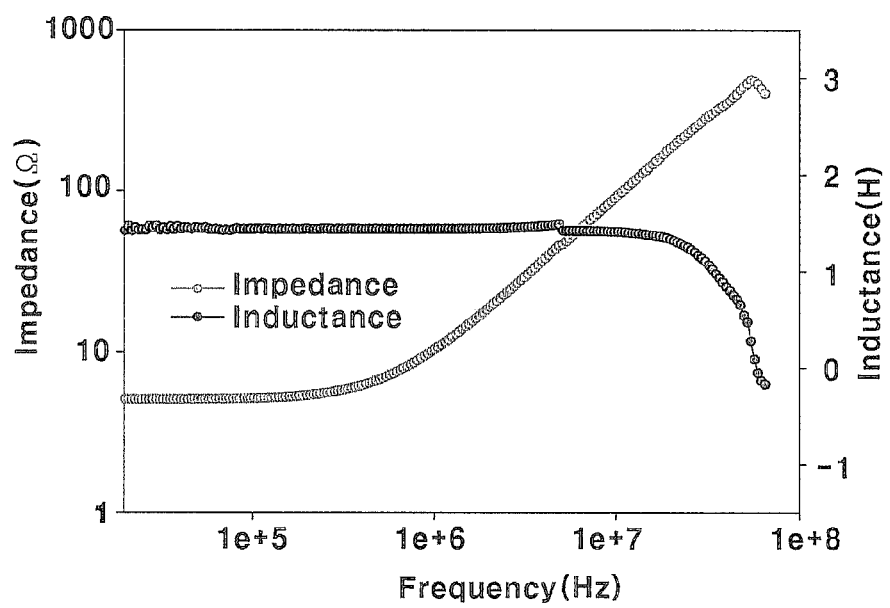
FIG. 7 is a graph showing frequency impedance inductance of the embroidered circuit in Example 5.

A silver-plated copper filament having a diameter of 0.040 mm (DC resistance: 13.7 Ω/m) is covered with 150 TPM around the surface of a strand of polyester yarn 75d/36f. And this silver-plated copper filament covered polyester yarn is twisted in S direction with 550 TPM. Three strands with S twist are plied together with 400 TPM in Z direction to prepare a metal composite embroidery yarn. The metal composite embroidery yarn thus prepared is then computer-embroidered on a polyester fabric whose warp and weft have similar tensile strength, thereby producing a textile inductor that controls electromagnetic waves. The inductance, resonance frequency and phase of the textile inductor thus produced are shown in table 1 and in FIG. 7.

TABLE 1

| construction | | | | | |
|---|---|---|---|---|---|
| Outside diameter (mm) | Number of turns (times) | Distance between lines (mm) | Inductance (μH) | Resonance frequency (MHz) | Phase (°) |
| 40 | 6 | 2 | 1.44 | 53.64 | 78.21 |

EXAMPLE 6

Manufacture of Rectangular, Spiral Textile Inductor

A silver-plated copper filament having a diameter of 0.040 mm (DC resistance: 13.7 Ω/m) is covered with 150 TPM around a strand of polyester yarn 75d/36f. And this silver-plated copper filament covered polyester yarn is twisted in S direction with 550 TPM. Three strands with S twist are plied together in Z direction with 400 TPM to prepare a metal composite embroidery yarn. The metal composite embroidery yarn thus prepared is then computer-embroidered on a polyester fabric whose warp and weft have similar tensile strength, thereby producing a textile inductor that controls electromagnetic waves. The inductance, resonance frequency and phase of the textile inductor thus produced are shown in table 2 below.

TABLE 2

| construction | | | | | |
|---|---|---|---|---|---|
| Length (mm) | Number of turns (times) | Distance between lines (mm) | Inductance (μH) | Resonance frequency (MHz) | Phase (°) |
| 52 | 7 | 1.6 | 3.382 | 52.6 | 85.02 |

The invention claimed is:

1. A method for producing conductive metal composite embroidery yarn, comprising:
    a first process in which one or more metal filaments are wound in a covered state around the surface of fiber yarn to have a plurality of twists per meter;
    a second process in which the fiber yarn wound with metal filaments in the first process is twisted in S direction to have a plurality of twists per meter; and
    a third process in which two or more of the twisted yarns in S direction are plied in Z direction to have a plurality of twists per meter,
    wherein the metal filament is insulated.

2. The method for producing conductive metal composite embroidery yarn according to claim 1, wherein the insulation is an enamel coating.

3. The method for producing conductive metal composite embroidery yarn according to claim 1, wherein the metal filament is covered with multifilament yarns of 30 deniers or less for protection.

4. An embroidered circuit comprising a metal composite embroidery yarn and a dielectric fabric substrate, in which the metal composite embroidery yarn is embroidered on the dielectric fabric substrate,
    wherein the metal composite embroidery yarn is produced by: a first process in which one or more metal filaments are wound in a covered state around the surface of fiber yarn to have a plurality of twists per meter; a second process in which the fiber yarn wound with metal filaments in the first process is twisted in S direction to have a plurality of twists per meter; and a third process in which two or more of the S-twisted yarns are plied in Z direction to have a plurality of twists per meter, and
    wherein the metal filaments are covered with multifilament yarns of 30 deniers or less for protection.

* * * * *